United States Patent
Freund et al.

(12) 
(10) Patent No.: US 6,249,955 B1
(45) Date of Patent: Jun. 26, 2001

(54) LASER BAR TRANSPORT METHOD

(75) Inventors: Joseph Michael Freund, Fogelsville; George John Przybylek, Douglasville; Dennis Mark Romero, Macungie, all of PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/417,709

(22) Filed: Oct. 13, 1999

(51) Int. Cl.[7] ....................................... B23Q 7/00
(52) U.S. Cl. .................. 29/559; 29/281.4; 29/281.5; 118/729; 118/500; 414/937; 211/41.18; 269/296; 269/224; 269/310; 193/25 R
(58) Field of Search ................... 29/559, 281.5, 29/281.4; 118/729, 500; 414/937; 211/175, 41.18; 269/296, 224, 310; 193/25 S, 25 FT, 25 R

(56) References Cited

U.S. PATENT DOCUMENTS 4,979,464 * 12/1990 Kunze-Concewitz et al. ...... 118/719
6,146,463 * 11/2000 Yudovsky et al. .................. 118/719

FOREIGN PATENT DOCUMENTS

0806494A1 * 11/1997 (EP) .

* cited by examiner

*Primary Examiner*—S. Thomas Hughes
*Assistant Examiner*—John C. Hong
(74) *Attorney, Agent, or Firm*—Dickstein Shapiro Morin & Oshinsky LLP

(57) ABSTRACT

A coating fixture adapted to extricate a jammed connector web is described. The coating fixture includes a pair of vertical supports. Each support has a first portion spaced apart from a second portion. Springs are placed between the first and second portions to allow movement of the first portions relative to the second portions. The second portions may be anchored to prevent their movement.

8 Claims, 3 Drawing Sheets

LASER BAR TRANSPORT METHOD

FIELD OF THE INVENTION

The present invention is generally related to the coating of semiconductor laser bars. More particularly, the present invention is related to a laser bar coating fixture which is designed to prevent jamming of a portion thereof.

BACKGROUND OF THE INVENTION

Apparatus for holding semiconductor laser bars for transport to and from and during a coating process are known. A known apparatus 10, as shown in FIG. 1, includes a pair of vertical supports 12, a connector web 20, and a plurality of webs 30. Each support has a track 14 in which the connector web 20 moves.

The connector web 20 includes a main portion 22, an intermediate portion 24, and an interlocking portion 26. The webs 30 each have interlocking clips 32, a main portion 36, and interlocked flanges 34. The clips 32 of the uppermost web 30 attach to the interlocking portion 26 of the connector web 20. The clips 32 of each subsequent web 30 attach to the flanges 34 of the next above web 30. In this way, a train of interlocking webs 30 can be attached to the connector web 20.

A laser bar 50 is positionable on a top surface 37 of the main portion 36 between the pair of interlocking portions 26 (FIG. 2).

One problem encountered in the operation of the above-described apparatus 10 is that sometimes the connector web 20 becomes stuck at jam points 40 in the track 14. This is sometimes due to improper alignment caused by the connector web 20 being imbalanced at its center of gravity and tipping in one direction. This imbalance may be caused by laser bars 50 not being uniformly loaded on the webs 30. Such nonuniform loading may lead to laser bars falling out of the webs 30 during the coating process. When properly aligned, the connector web 20 fits snugly within the tracks 14, since a width $d_1$ of the connector web 20 is slightly less than a distance $d_3$ between the tracks 14. Length $d_2$, which corresponds to the distance between the points on the connector web 20 which become jammed at the jam points 40, is greater than the width $d_1$ and equal to or greater than the distance $d_3$.

When the connector web 20 becomes jammed in the tracks 14, time must be taken to unjam the connector web 20. Care must also be taken to prevent disturbance of the laser bars 50 being carried on the top surfaces 37 of the webs 30. There thus exists a need for a coating fixture that does not become jammed by the connector web 20.

SUMMARY OF THE INVENTION

The present invention provides a coating fixture having a pair of vertical supports. The supports each have a first portion parallel to and spaced apart from a second portion by a plurality of springs. The first portions are movable relative to the second portions.

The present invention also provides an uncomplicated system for unjamming a connector web jammed in a coating fixture. The system includes a coating fixture having a pair of supports, each having a track. The supports are movable relative to each other. A connector web is positionable in the tracks, and the supports move from a first position to a second position in response to the connector web becoming jammed in the tracks.

The present invention also provides a method for unjamming a connector web from tracks of a coating fixture by moving at least one of the tracks from a first position to a second position when the connector web becomes jammed and realigning the connector web within the tracks.

An object of the present invention is to provide an apparatus which easily extricates a train of webs jammed in tracks within the apparatus.

Another object of the present invention is to provide a system for preventing a train of webs from becoming jammed within a semiconductor bar transport apparatus.

According to one aspect of the invention, supports are provided, at least one of which has a spring-based portion which is movable to allow for extrication of the jammed train of webs.

These and other features and advantages of the invention will be more clearly understood from the following detailed description of the invention which is provided in connection with the accompanying drawings.

DETAILED DESCRIPTION OF THE PREFERRED EMBODIMENTS

Figure 2:
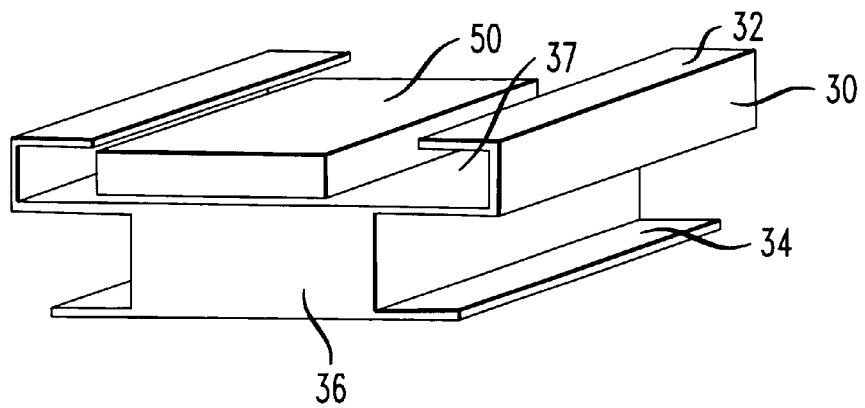
FIG. 2 is a perspective view of a web of the fixture of FIG. 1.
Figure 3:
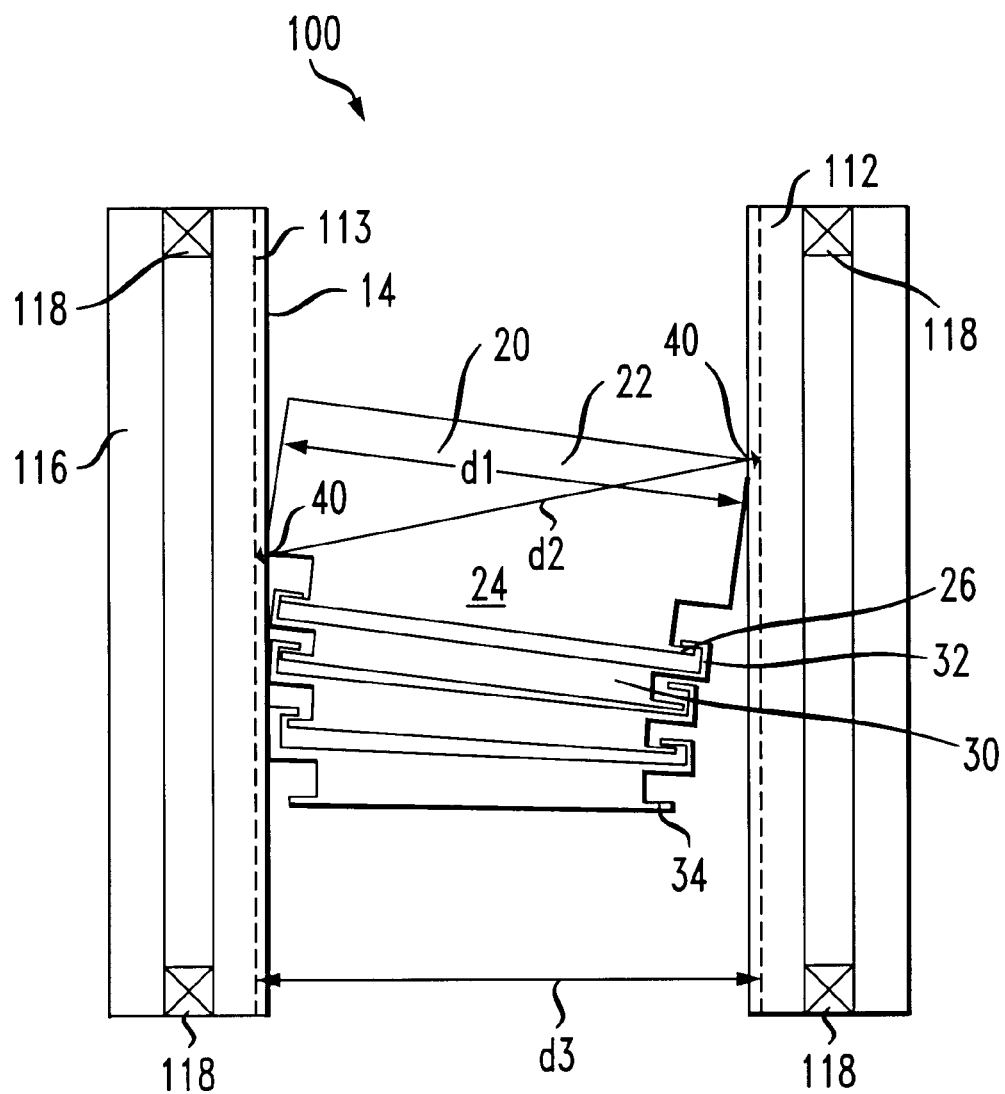
FIG. 3 is a side view of a coating fixture constructed in accordance with an embodiment of the invention.
Figure 4:
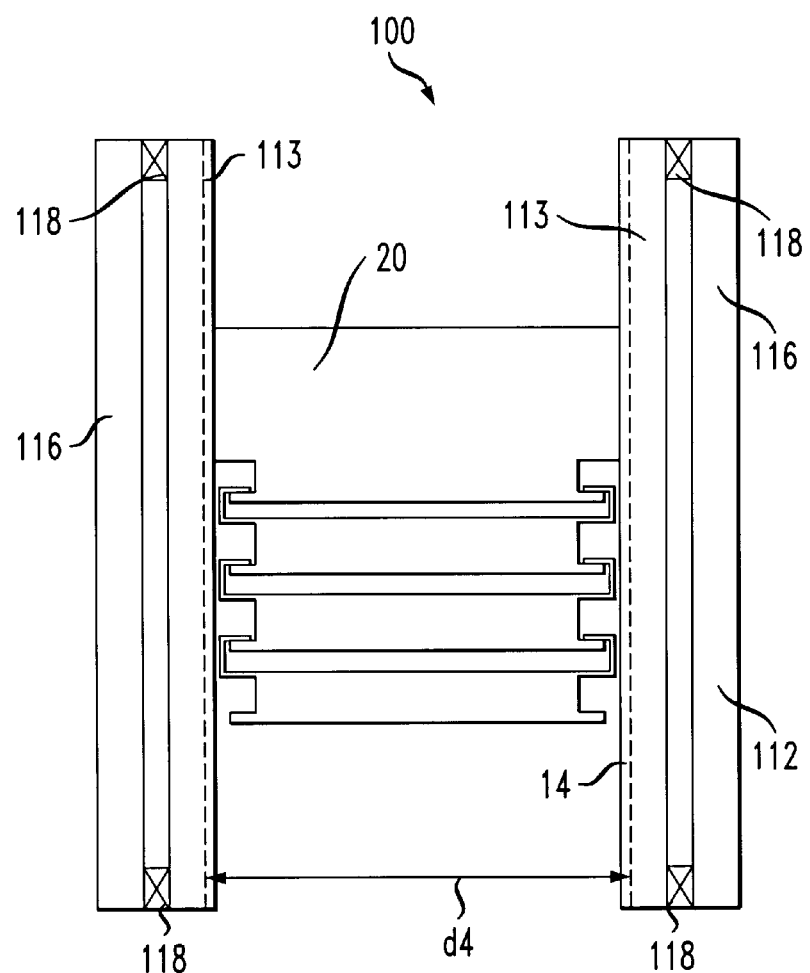
FIG. 4 is another side view of the coating fixture of FIG. 3.
Figure 5:
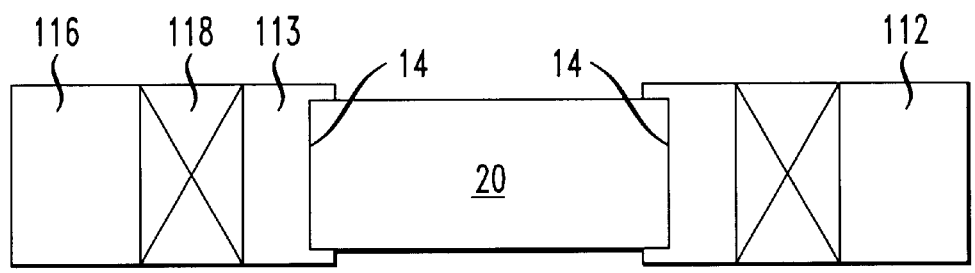
FIG. 5 is a top view of the coating fixture of FIG. 3.

FIGS. 3–5 show a coating fixture 100 which holds and transports a connector web 20 and webs 30. The webs 30 each hold a laser bar 50 (FIG. 2) for coating facet edges thereof. The fixture 100 has a pair of vertical supports 112. Each support 112 has a first portion 113 and a second portion 116. Each first portion 113 includes the track 14 in which the connector web 20 is positioned.

The first portions 113 are moveable relative to the respective second portions 116. Specifically, springs 118 are located between the first and second portions 113, 116. The springs 118 may be tension springs, elastomeric material, or other structures suitable to provide movement between the first and second portions 113, 116. The second portions 116 may be anchored during the loading and unloading of the connector web 20.

In its initial position, the tracks 14 of the fixture 100 are positioned the distance $d_3$ apart, which as noted above is greater than the width $d_1$ of the connector web 20 and equal to or greater than the length $d_2$. When portions of the connector web 20 begin to get jammed at jam points 40, the weight of the connector web 20 and webs 30 provides a force on the first portions 113, creating movement of the first portions 113 toward the second portions 116. The force causes the springs 118 to become compressed. The tracks 14 of the fixture 100 move temporarily to a second position where a distance $d_4$ (FIG. 4) between the tracks 14 is greater than the length $d_2$. This allows the connector web 20 to become realigned in the tracks 14, which in turn leads the springs 118 to relax and move the first portions 113 back toward each other to the initial position.

Alternatively, an outside force, in addition to that of the weight of the connector web 20 and the webs 30, may be applied to the connector web 20 to provide sufficient force to move the first portions 113 from the initial position to the second position.

Figure 1:
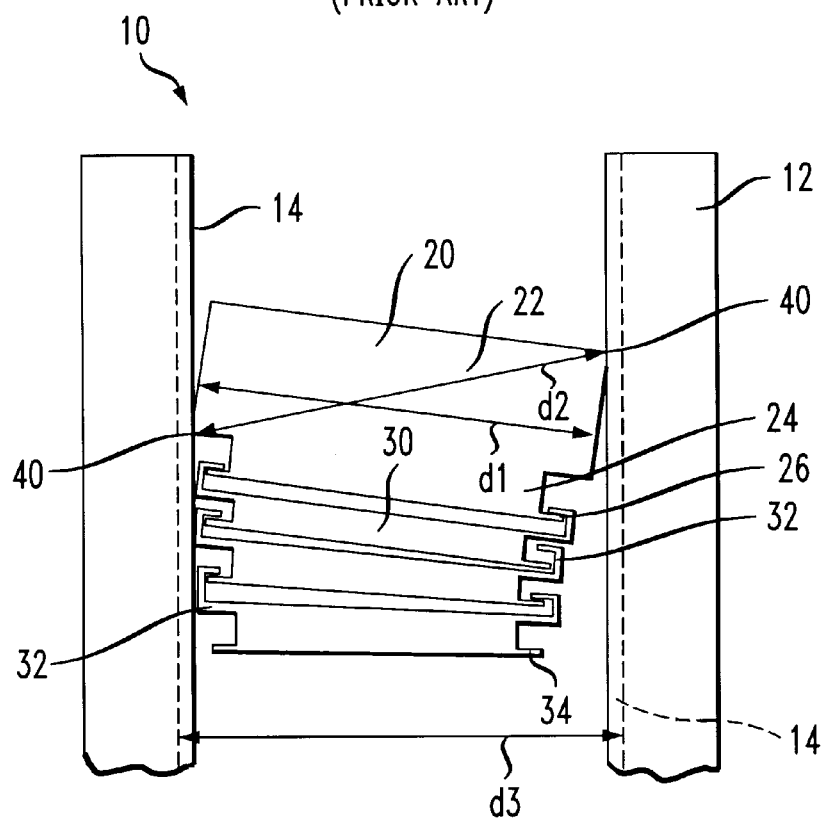
FIG. 1 is a partial side view of a known coating fixture.

The laser bars 50 have been omitted from FIGS. 1 and 3–4 for clarity of illustration only. Further, although a few of the webs 30 are illustrated, it is to be understood that twenty-five or more webs 30 may make up an interconnected web train attached to the connector web 20.

The described coating fixture 100 provides a simple mechanism for extricating the connector web 20 if it becomes jammed during closure or opening of the apparatus 100. This increases the processing of the laser bars 50. The fixture 100 is efficient and easily frees jammed conductor webs 20.

In operation, the connector web 20 is hung in the tracks 14. The individual webs 30 are interconnected with the connector web 20, and the laser bars 50 are placed on the surfaces 37. To transport the apparatus 100, the train of webs 30 must be rendered immobile. This is generally done by pushing the connector web 20 down on the webs 30, thereby compressing, or closing, the space of the train. Each web 30 is pushed down such that its flange 34 contacts the laser bar 50 positioned beneath it on the surface 37 of the adjacent web 30. After the fixture 100 has been transported to and from the laser bar coating process, i.e. the evaporator, the train may be decompressed, or opened, by pulling up on the connector web 20.

During the compressing and decompressing actions, the connector web 20 may become stuck at jam points 40 in the tracks 14. The connector web 20 may tilt out of alignment due to an asymmetrical pushing or pulling or to uneven weight distribution in the webs 30, known as web tilting. The tilting of the connector web 20 leads to the sticking in the tracks 14.

Upon the connector web 20 becoming stuck, the pushing or pulling force, or gravity, will exert a force normal to the plane of the tracks 14, pushing the tracks 14 and the first portions 113 outwardly. This provides greater room for the connector web 20, allowing it to right itself.

While the invention has been described in detail in connection with preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while two sets of moveable first portions 113 with springs 118 are illustrated and described, it is to be understood that a single first portion 113 with one or more springs 118 may instead be incorporated in the fixture 100. Accordingly, the invention is not to be seen as limited by the foregoing description, but is only limited by the scope of the appended claims.

What is claimed as new and desired to be protected by Letters Patent of the United States is:

1. A method of handling semiconductor products in a coating apparatus, said method comprising the steps of:
   providing a moveable support device between tracks;
   locating said semiconductor products on said moveable support device;
   moving at least one of said tracks from a first position to a second position, the second position placing the tracks farther apart than the first position; and
   aligning the support device within the tracks.

2. The method of claim 1, wherein the tracks are moved back to the first position after the aligning step.

3. The method of claim 1, wherein the support device has a width and wherein the width is greater than the distance between the tracks in the first position and less than the distance between the tracks in the second position.

4. The method of claim 1, wherein said moving step comprises moving a pair of support first portions toward a pair of support second portions, each first portion having one of said tracks, said first portions being located between said second portions.

5. The method of claim 4, wherein springs are used to move the first portions relative to the second portions.

6. The method of claim 1, wherein the support device includes at least one web connected to a connector web.

7. The method of claim 6, wherein the connector web is aligned by gravity.

8. The method of claim 4, further comprising anchoring the second portions to prevent their movement.

* * * * *